(12) United States Patent
Balaganesan et al.

(10) Patent No.: US 9,306,096 B2
(45) Date of Patent: Apr. 5, 2016

(54) ELECTRICALLY CONDUCTING COMPOSITIONS FOR ORGANIC ELECTRONIC DEVICES

(71) Applicant: E-RAY OPTOELECTRONICS TECHNOLOGY CO., LTD., Chung-Li (TW)

(72) Inventors: Banumathy Balaganesan, Chung-Li (TW); Cheng-Chung Yao, Chung-Li (TW); Abraham Joseph Kakanat, Calgary (CA)

(73) Assignee: E-RAY OPTOELECTRONICS TECHNOLOGY CO., LTD., Chung-Li (TW)

( * ) Notice: Subject to any disclaimer, the term of this patent is extended or adjusted under 35 U.S.C. 154(b) by 214 days.

(21) Appl. No.: 13/968,988

(22) Filed: Aug. 16, 2013

(65) Prior Publication Data

US 2014/0048747 A1    Feb. 20, 2014

Related U.S. Application Data

(60) Provisional application No. 61/683,984, filed on Aug. 16, 2012.

(51) Int. Cl.
| | |
|---|---|
| H01B 1/00 | (2006.01) |
| H01L 31/0256 | (2006.01) |
| H01L 51/00 | (2006.01) |
| B82Y 10/00 | (2011.01) |
| H01L 51/50 | (2006.01) |

(52) U.S. Cl.
CPC ............ *H01L 31/0256* (2013.01); *B82Y 10/00* (2013.01); *H01L 51/0035* (2013.01); *H01L 51/0037* (2013.01); *H01L 51/0049* (2013.01); *H01L 51/5088* (2013.01)

(58) Field of Classification Search
CPC ............ H01L 51/0035; H01L 51/0048; H01L 51/5076; H01L 31/0256; B82Y 10/00
USPC .................................. 252/500, 510; 428/172
See application file for complete search history.

(56) References Cited

U.S. PATENT DOCUMENTS

| | | | |
|---|---|---|---|
| 4,769,292 A | 9/1988 | Tang et al. | |
| 5,707,745 A | 1/1998 | Forrest et al. | |
| 5,844,363 A | 12/1998 | Gu et al. | |
| 8,784,690 B2 * | 7/2014 | Badre et al. | 252/500 |
| 2010/0247870 A1 * | 9/2010 | Suzuki et al. | 428/172 |

FOREIGN PATENT DOCUMENTS

| | | |
|---|---|---|
| JP | 2009069523 | 4/2009 |
| WO | WO2004043117 | 5/2004 |
| WO | WO2005107335 | 11/2005 |

* cited by examiner

*Primary Examiner* — Khanh Tuan Nguyen
(74) *Attorney, Agent, or Firm* — Muncy, Geissler, Olds & Lowe, P.C.

(57) ABSTRACT

The present invention discloses an electrically conducting composition that include a charge transporting oligomer selected either from oligoanilines and/or oligothiophenes and electron accepting dopants; and further contain conductivity enhancing substances such as ionic liquids, or a nanoparticle, dissolved in a mixture of at least two solvents to achieve the desired formulation for making the electrically conductive layer for organic electronic devices.

10 Claims, 4 Drawing Sheets

ELECTRICALLY CONDUCTING COMPOSITIONS FOR ORGANIC ELECTRONIC DEVICES

CROSS-REFERENCE TO RELATED APPLICATION

This application claims priority of U.S. Provisional Application No. 61/683,984 filed on Aug. 16, 2012 under 35 U.S.C. §119(e), the entire contents of all of which are hereby incorporated by reference.

BACKGROUND OF THE INVENTION

1. Field of the Invention

The present invention relates to an electrically conducting composition. More particularly, the present invention relates to an electrically conducting composition that includes a charge transporting oligomer for organic electronic devices.

2. Description of Related Art

There has been an increasing demand in developing novel organic materials that cater to organic light emitting device (OLED) applications. Such devices are commercially attractive because they offer the cost-effective fabrication of high density pixeled displays exhibiting brilliant luminance with long life times, high efficiency, low driving voltages and wide color range.

A typical OLED has at least one organic emissive layer sandwiched between an anode and a cathode. When a current is applied, the anode injects holes and the cathode injects electrons into the organic layer(s). The injected holes and electrons each migrate toward the oppositely charged electrode. When an electron and hole localize on the same molecule, an "exciton", which is a localized electron-hole pair having an excited energy state, is formed. Light is emitted when the exciton relaxes through a photo emissive mechanism. To improve the charge transport capabilities and also the luminous efficiency of such devices, additional layers around the emissive layer, such as an electron transport layer and/or a hole transport layer, or an electron blocking and/or hole blocking layer(s) have been incorporated. Doping the host material with another material (guest) has been well demonstrated in literature to enhance the device performance and to tune the chromaticity. Several OLED materials and device configurations are described in U.S. Pat. Nos. 4,769,292, 5,844,363, and 5,707,745, which are incorporated herein by reference in their entirety.

Indium-tin oxide (ITO) possesses a relatively low work function (WF=4.9 eV), new hole-injection layers (HILs) with a high ionization potential (IP) are required for efficient hole injection. Small molecules such as such as copper phthalocyanine (CuPc); 4,4',4''-tris(3-methylphenyl-N-phenylamino)triphenylamine (m-MTDATA); and 4,4',4''-tris[N-(2-naphthyl)-N-phenyl amino]triphenylamine (2TNATA), have been preferentially employed as HILs in vacuum-deposited, small-molecule organic light-emitting diodes (OLEDs). Although conducting polymers such as poly (ethylene dioxythiophene) doped with polystyrene sulfonic acid (PEDOT:PSS) and polyaniline doped with polystyrene sulfonic acid (PANI:PSS) are alternatives to small-molecule HILs in OLEDs, only a few reports have described solution-processed HILs in OLEDs because of the remaining high injection barrier and low efficiency.

Polyaniline and polythiophenes, which are widely used hole injection material in polymeric light emitting devices (PLED), exhibits a device deterioration due to the residual water content and are difficult to control purity as described in JP 2009069523, JP 2009069523.

Patent documents WO2005107335, WO2004043117 have described conductive coating materials made of homogeneos solutions containing low-molecular weight oligoaniline or oligothiophene materials are useful substitutes for conventional materials. The low molecular weight oligomeric compounds of the charge transporting material significantly changes the physical properties, such as charge transporting performance, ionization potential, conductivity, solubility, viscosity, film morphology, etc. For example, the oligoaniline derivative has the quinoimine in its oxidized state, which remarkably reduces the solubility in organic solvents but plays a main role to its conductivity. By means of a chemical reduction of the quinoimines with hydrazine, the solubility of the oligoaniline may be improved partially; however, the conductivity of the film is very low. Doping of oligoanilines with conductivity enhancing salts without decreasing the solubility, remains a challenge in the solution processible OLEDs.

SUMMARY OF THE INVENTION

The present invention Provides an electrically conducting composition, comprising: a charge transporting oligomer 1 to 5% by weight based on the total weight of the electrically conducting composition; an electron accepting dopant of 0.001 to 5% by weight based on the total weight of the electrically conducting composition; and at least two solvents.

In one embodiment, the electrically conducting composition further comprises 1,3-dialkylimidazolium ionic liquid of 0.01 to 0.5% by weight based on the total weight of the electrically conducting composition.

In one embodiment, the electrically conducting composition further comprises carbon nano particles of 0.0001 to 0.01% by weight based on the total weight of the electrically conducting composition.

In one embodiment, the carbon nanoparticles are selected from the group consisting of multi walled carbon nanotube (MWCNT), modified MWCNT, and MWCNT composite.

In one embodiment, the charge transporting oligomers are selected from the group consisting of oligoanilines, amino oligoanilines, oligothiophenes and mixtures thereof.

In one embodiment, each of the charge transporting oligomers has a number of monomer units from 2 to 16.

In one embodiment, the electron accepting dopant is a sulfonic acid group containing a compound.

In one embodiment, the sulfonic acid group containing a compound is selected from the group consisting of 5-sulfosalicylic acid, polystyrene sulfonic acid, dodecyl benzene sulfonic acid, toluene sulfonic acid and perfluorinated sulfonic acid polymer.

In one embodiment, the at least two solvents are selected from the group consisting of cyclohexanol, 1,3-dimethyl-2-imidazolidinone, dimethylacetamide, dimethylsulfoxide, dimethylformamide, N-methyl pyrrolidone, toluene, xylene, tetralone, butanol, ethylene glycol and glycerol.

In one embodiment, the alkyl groups of imidazolium ionic liquid are in a range of from C1 to C16 and the 1,3-dialkylimidazolium ionic liquid has a corresponding anion selected from the group consisting of hexafluoro phosphate, tetra fluoroborate, and trifluoromethane sulfonamide.

DETAILED DESCRIPTION OF THE PREFERRED EMBODIMENTS

Figure 1:
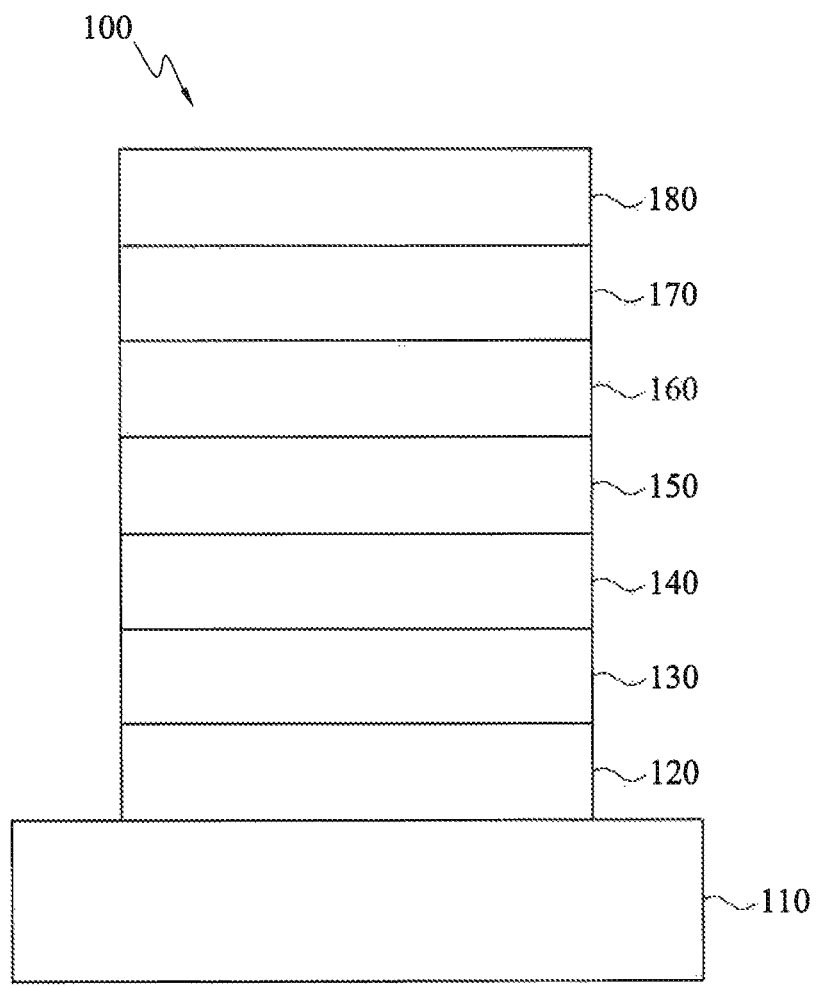
FIG. 1 is a cross-sectional view illustrating one example of an organic light emitting according to an embodiment of the present invention.

The detailed description of the present invention is illustrated by the following specific examples. Persons skilled in the art can conceive the other advantages and effects of the present invention based on the disclosure contained in the specification of the present invention.

The present invention has been made in order to solve the problems described above, and is an electrically conducting composition that includes a charge transporting oligomer selected from oligoanilines and oligothiophenes, conductivity enhancing dopants dissolved in a mixture of at least two solvents; further the electrically conducting composition may further comprises an ionic liquid and/or a nanoparticle present in a range of $10^{-4}$ to 1.0 weight percentage to achieve the desired formulation for making the electrically conductive layer for organic electronic devices.

The electrically conducting composition according to the present invention comprises a charge transporting oligomer selected from group consisting of oligoanilines (Ia), amino oligoanilines (Ib), oligothiophenes (Ic, Id) and mixtures thereof, more preferably, alkyl, aryl substituted or unsubstituted oligoanilines, alky, aryl substituted or unsubstituted amino-end grouped oligoanilines, alkyl, aryl substituted or unsubstituted oligothiophenes—wherein R may be selected from hydrogen, alkyl having one carbon atom to 10 carbon atoms (C1 to C10) or aryl group having 6 carbon atom to 10 carbon atoms (C6 to C10). According to the present invention the charge transporting oligomer has a number of conjugated units (n) from 2 to 16, and the molecular weight not exceeding 5000 Daltons; the conjugated units being homogeneos and continuously arranged or being heterogeneous and randomly arranged. m, n, k are integers wherein n, (m+k) ranges from 2 to 16.

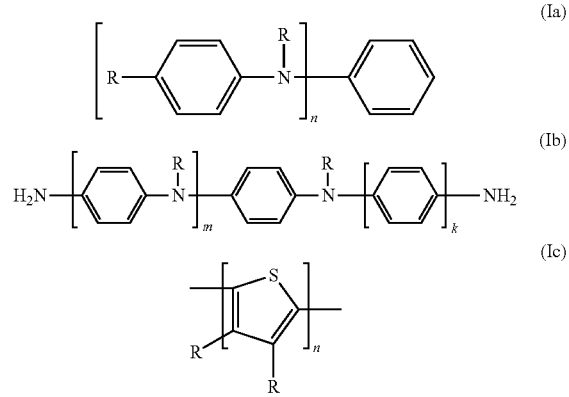

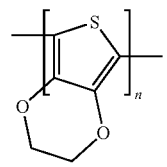

Incidentally, these oligomer derivatives may be synthesized by any process which is not specifically restricted. Typical procedures are disclosed in the following literatures: Synthetic Metals. 1997, 84, p. 119; Journal of Macromoecular Rapid Communications 2008, 29, p. 280; Bulletin Chemical society of Japan, 1994, 67, p. 1749; Proceedings of the Yerevan State University, Chemistry and Biology, 2013, 1, p. 7; Heterocycles, 1987, 26, p. 939; Heterocycles, 1987, 26, p. 1793.

According to the present invention, the electron accepting dopant substance may preferably be a sulfonic acid derivative, which is present in 0.001 to 5% by weight; it is not specifically restricted in solubility so long as it is soluble in at least one kind of solvent used for the composition. The sulfornic acid derivative may be selected from the group consisting of 5-sulfosalicylic acid, polystyrene sulfonic acid, dodecyl benzene sulfonic acid, toluene sulfonic acid and perfluorinated sulfonic acid polymer.

Further, the present invention comprises ionic liquids. Ionic liquids are solvents that consist of an organic cation and inorganic anion as the counterpart. Ionic liquids have also been termed as Green solvents and they possess special characteristics such as high ionic conductivity, good thermal stability and a tunable window of electrochemical stability. In the present invention, ionic liquid act as a conductivity dopants as well as a solvent to increase the solubility of the charge transporting oligomer 1,3-dialkyl imidazolium type ionic liquids are chosen for the present invention as represented by the formula

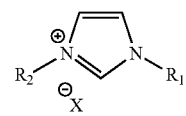

Wherein R1, R2 are alkyl substituents having C1-C16 and the corresponding union X may be selected from the group hexafluoro phosphate ($PF_6$), tetra fluoroborate ($BF_4$), and trifluoromethane sulfonamide [$(CF_3SO_2)_2N$], and is present in 0.01 to 0.5% by weight in the electrically conducting composition.

The present invention further comprises use of a carbon nano-particle, in the range of 0.0001 to 0.01% by weight in the total composition. The carbon nanoparticles are selected from the group consisting of multi walled carbon nanotube (MWCNT), modified MWCNT (sulfonated MWCNT), and MWCNT composite. The nanoparticle also contributes to the conductivity of the composition. Carbon nanoparticles may be either added as a composite of the charge transporting oligomer or added during the process of mixing the different ingredients of the formulation. Sulfonated MWCNT was prepared by the procedure detailed as in Carbon, 2005, 43, p. 2405.

The electrically conducting composition according to present invention comprises at least two solvents, and are selected from the group consisting of cyclohexanol, 1,3-dimethyl-2-imidazolidinone, dimethylacetamide, dimethylsulfoxide, dimethylformamide, N-methyl pyrrolidone, toluene, xylene, tetralone, butanol, ethylene glycol and glycerol. Dissolution or dispersion may be accomplished by stirring, stirring with heating, or ultrasonic dispersion.

The method of coating is not specifically restricted. Coating may be accomplished by wet processes such as spin coating, dip coating, blade-knife coating, roll-coating, transfer printing or brushing. Coating may be performed under a stream of inert gas such as nitrogen or argon but not restricted to.

Solvent evaporation may be accomplished by heating with an oven or hot plate and is not specifically restricted. Heating temperature is usually 80-200° C., which is high enough for solvent evaporation.

The thus obtained thin film should be thoroughly baked in the presence of oxygen which contributes to improved conductivity.

The conductive film to be obtained by coating and subsequent evaporation is not specifically restricted to thickness. However, for the application as a hole injecting or transporting layer in an organic electroluminescent (EL) device, it is desirable to have a thickness ranging from 5 to 250 nm. The film thickness may be varied by adjusting the concentration of the ingredients (or the solid content) present in the composition and by adjusting the amount of the composition applied to the substrate.

Further aspect of this invention relates to an organic electroluminescent device that utilizes the aforementioned electrically conducting composition as described above, in hole-injection layer or hole-transporting layer, employed in fabricating fluorescent or phosphorescent organic electroluminescent devices.

EXPLANATION OF SYMBOLS

In FIG. 1, 110 substrate; 120 anode; 130 a hole injection layer; 140 a hole transport layer; 150 an emissive layer; 160 an electron transport layer; 170 an electron injection layer; 180 a cathode.

Figure 2:
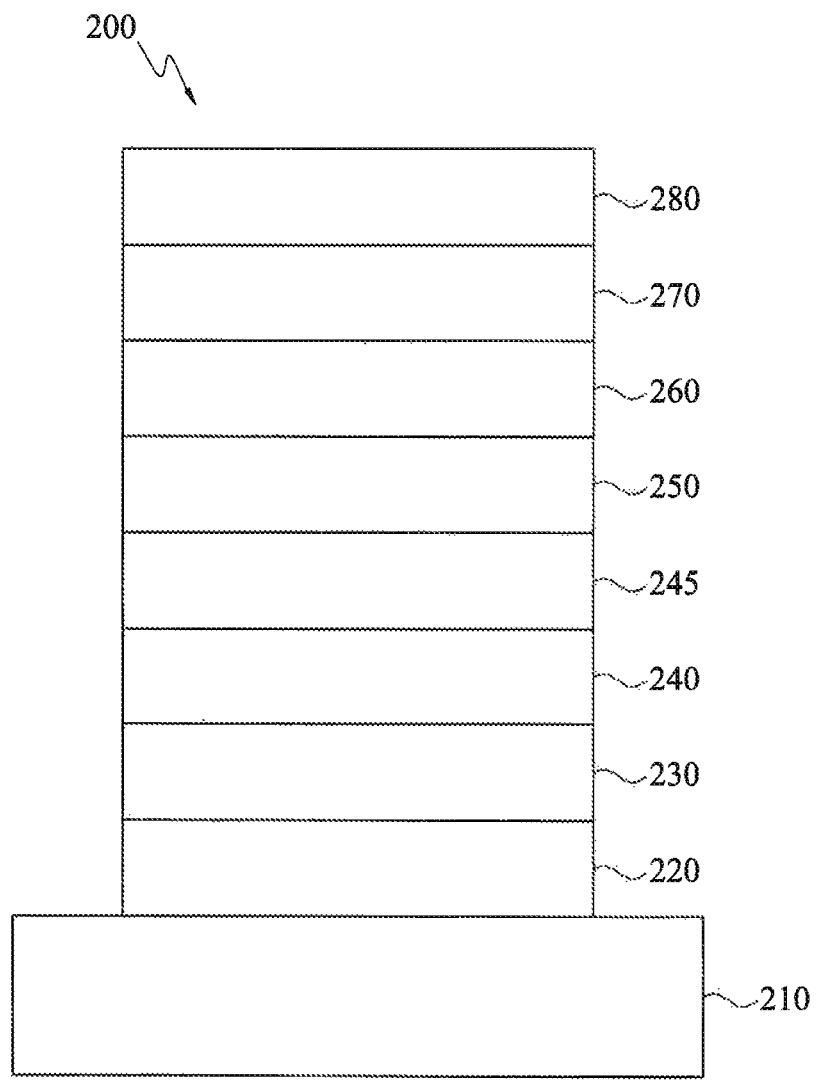
FIG. 2 is a cross-sectional view illustrating another example of an organic light emitting device according to another embodiment of the present invention.

In FIG. 2, 210 substrate; 220 anode; 230 a hole injection layer; 240 a hole transport layer; 245 an exciton blocking layer; 250 an emissive layer; 260 an electron transport layer; 270 an electron injection layer; 280 a cathode.

Figure 3:
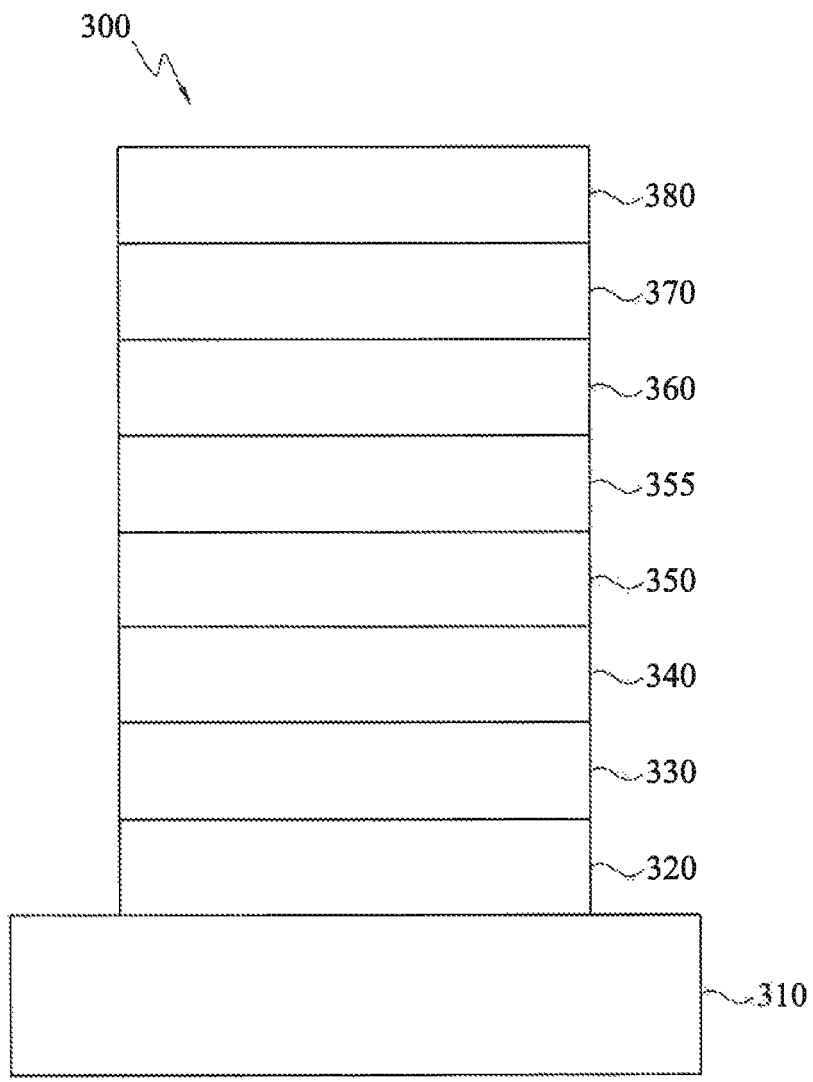
FIG. 3 is a cross-sectional view illustrating yet another example of an organic light emitting device according to another embodiment of the present invention.

In FIG. 3, 310 substrate; 320 anode; 330 a hole injection layer; 340 a hole transport layer; 350 an emissive layer; 355 a hole blocking layer; 360 an electron transport layer; 370 an electron injection layer; 380 a cathode.

PREFERRED EMBODIMENTS OF THE INVENTION

The structure of the organic EL device of this invention will be explained with reference to the drawing, but not limited thereto.

FIG. 1 which illustrates an embodiment is a schematic showing an organic light emitting device 100. Device 100 may include a substrate 110, an anode 120, a hole injection layer 130, a hole transport layer 140, an emissive layer 150, an electron transport layer 160, an electron injection layer 170, and a cathode 180. Device 100 may be fabricated by depositing the layers described, in order.

Hole injection layer 130 and/or the hole transport layer 140 may be deposited by means of the wet process of the current invention. All the other layers are deposited by organic vapor deposition method.

FIG. 2 which illustrates an embodiment is a schematic showing an organic light emitting device 200. Device 200 may include a substrate 210, an anode 220, a hole injection layer 230 deposited by means of wet process of the current invention, a hole transport layer 240, an excitation blocking layer 245, an emissive layer 250, an electron transport layer 260, an electron injection layer 270, and a cathode 280;

Hole injection layer 230 and/or the hole transport layer 240 may be deposited by means of the wet process of the current invention. All the other layers are deposited by organic vapor deposition method.

FIG. 3 which illustrates an embodiment is a schematic showing an organic light emitting device 300. Device 300 may include a substrate 310, an anode 320, a hole injection layer 330, a hole transport layer 340, an emissive layer 350, an exciton blocking layer 355, an electron transport layer 360, an electron injection layer 370, and a cathode 380;

Hole injection layer 330 and/or the hole transport layer 340 may be deposited by means of the wet process of the current invention. All the other layers are deposited by organic vapor deposition method.

It is possible to fabricate a device with a structure that is the reverse of the one shown in FIG. 1-3. In this case of the reverse structure, a layer or layers may be added or omitted as needed.

Materials used in hole transport layer, electron blocking layer, hole blocking layer, electron transport layer, electron injection layer and the emitting layer may be selected from those reported in the literature cited elsewhere.

Structures and materials not specifically described may also be used, such as OLEDs comprised of polymeric materials (PLEDs) such as disclosed in U.S. Pat. No. 5,247,190, which is incorporated by reference in its entirety. Further, OLEDs having a single organic layer may be used. OLEDs may be stacked as described in U.S. Pat. No. 5,707,745, which is incorporated by reference in its entirety.

EXAMPLES

This invention will be described in more detail below with reference to the examples; however, it will not be limited to these examples and it can be reduced to practice in various modes unless such practice exceeds the substance of this invention.

Synthesis

TABLE 1

| List of oligoanilines, OA-1 to OA-4 | |
|---|---|
| Entry | Oligoaniline analogue |
| OA-1 | Tetramer |
| OA-2 | Octamer |
| OA-3 | Hexadecamer |
| OA-4[a] | Dimer |

[a]amino-oligoaniline

Synthesis Examples OA-5 to OA-10

Preparation of the MWCNT-Aniline Tetramer 0.05 g of modified MWCNT was dispersed in toluene (150 ml) and sonicated for 60 min and added 5.0 g of N-phenyl-1,4-phenylenediamine followed by 8.0 g of ammonium persulfate dissolved in 20 ml of 1M sulfuric acid. Stirred at room temperature for 24 h. Filtered and washed with (5×50 ml). Dried under vacuum to get quantitative yield.

Following the above procedures, OA-5 to OA-10 were prepared and are shown in Table 2.

TABLE 2

MWCNT containing oligoanilines, OA-5 to OA-10

| Entry | Weight Ratio of oligoaniline:modified MWCNT | General molecular structure of the product |
|---|---|---|
| OA-5 | 1:0.01 | Oligoaniline-tetramer-MWCNT |
| OA-6 | 1:0.03 | Oligoaniline-tetramer-MWCNT |
| OA-7 | 1:0.01 | Oligoaniline-octamer-MWCNT |
| OA-8 | 1:0.03 | Oligoaniline-octamer-MWCNT |
| OA-9 | 1:0.01 | Oligoaniline-hexadecamer-MWCNT |
| OA-10 | 1:0.03 | Oligoaniline-hexadecamer-MWCNT |

Synthesis of OA-11 to OA-16

Preparation of the MWCNT-Oligo(Aniline-EDOT) Derivatives

Modified MWCNT (0.50 g) dispersed in toluene (1.00-150 ml) and sonicated for 60 min. Added 1.60 g of N-phenyl-1,4-phenylenediamine and 1.6 g of 3,4-ethylenedioxylthiophene to the above, dispersion and sonicated again for another 30 min. 3.0 g of ammonium persulphate was dissolved in 20 ml $H_2SO_4$ and added dropwise to the above solution and stirred at RT for 24 h. The reaction mixture was filtered under vacuum. The precipitate was washed with water (3×50 ml) until the washings were turned to neutral pH and dried under vacuum for 24 h. The products were analyzed by thermogravimetric analysis which showed decomposition at higher temperature than that does not contain MWCNT, indicating its incorporation. Various MWCNT-oligo(aniline-EDOT) derivatives are shown in Table 3.

TABLE 3

MWCNT-oligo(aniline-EDOT) derivatives, OA-11 to OA-16

| Entry | Weight Ratio of Oligoaniline:EDOT:modified MWCNT |
|---|---|
| OA-11 | 1:1:0.01 |
| OA-12 | 1:1:0.03 |
| OA-13 | 1:1:0.01 |
| OA-14 | 1:1:0.03 |
| OA-15 | 1:1:0.01 |
| OA-16 | 1:1:0.03 |

General Procedure for Formulation

The electrically conducting charge transporting formulation was prepared as follows: The charge transporting oligomer, and the other ingredients such as electron accepting dopant, ionic liquid and nanoparticle were taken and the selected two solvents were added and mixed under untrasonic stirring for 30 min. Tables 4 & 5 shows the various formulation examples.

TABLE 4

Electrically conducting compositions, FEX-1 to FEX-6

| Entry | Material; g | D2 (g) | D3 (g) | D4 (g) | A (ml) | B (ml) | C (ml) |
|---|---|---|---|---|---|---|---|
| FEX-1 | OA-10; 0.12 g | 2.0 | — | 0.008 | 4.0 | 2.0 | 2.0 |
| FEX-2 | OA-10; 0.10 g | 2.0 | — | 0.010 | 4.0 | 2.0 | 2.0 |
| FEX-3 | OA-5; 0.05 g | 1.0 | — | 0.050 | 5.0 | 2.0 | 2.0 |
| FEX-4 | OA-6; 0.05 g | 1.0 | — | 0.050 | 5.0 | 2.0 | 2.0 |
| FEX-5 | OA-5; 0.17 g | 5.0 | 0.002 | — | 3.0 | — | — |
| FEX-6 | OA-5; 0.17 g | 5.0 | 0.002 | — | 3.0 | — | 2.0 |

A - Dimethyl sulfoxide (DMSO)
B - Tetralone;
C - 1,3-dimethyl imidazolidinone (DMI)
D2 - perfluorinated sulfonic acid polymer, Nafion-H;
D3 - 5-sulfo salicylic acid (5-SSA)
D4 - 1-butyl-3-methylimidazolium hexafluorophosphate Various electrically conducting composition examples were prepared using the dimeric oligoaniline (Example 4) as the main ingredient (Table 5)

TABLE 5

Electrically conducting compositions with OA-4 (0.1 g)

| Entry | MWCNT (g) | D2 (ml) | D3 (g) | D4 (g) | G (ml) | H (ml) | A (ml) | K (ml) |
|---|---|---|---|---|---|---|---|---|
| FEX-7 | 0.001 | — | 0.006 | — | 2 | 9 | — | — |
| FEX-8 | 0.001 | 1 | 0 | — | 1 | 9 | — | — |
| FEX-9 | — | — | — | — | 2 | 9 | — | — |
| FEX-10 | — | 1 | — | — | 1 | 9 | — | — |
| FEX-11 | — | 0 | 0.006 | — | 2 | 9 | — | — |
| FEX-12 | — | 1 | 0.006 | — | 1 | 9 | — | — |
| Comparative FEX-1 | — | 1 | — | — | — | 2 | 8 | — |
| Comparative FEX-2 | — | 1 | 0.006 | — | — | 2 | 8 | — |
| Comparative FEX-3 | — | 1 | — | — | — | 2 | — | 8 |
| Comparative FEX-4 | — | 1 | 0.006 | — | — | 2 | — | 8 |
| FEX-13 | — | 0 | — | 0.05 | 2 | 9 | — | — |
| FEX-14 | — | 1 | — | 0.05 | 1 | 9 | — | — |
| FEX-15 | — | — | — | — | 2 | 13 | — | — |
| FEX-16 | — | — | 0.006 | — | 2 | 13 | — | — |
| FEX-17* | — | — | 0.006 | — | — | 13 | — | — |
| Comparative FEX-5** | — | — | 0.006 | — | — | 13 | — | — |

*OA-4 = 0.3 g
**OA-4 = 0.5 g
D2 - perfluorinated sulfonic acid polymer, Nafion-H;
D3 - 5-sulfo salicylic acid (5-SSA)
D4 - 1-butyl-3-methylimidazolium hexafluorophosphate
G - N,N-dimethyl formamide (DMF)
H - Xylene
A - Dimethyl sulfoxide (DMSO)
K - N-methyl pyrrolidinone (NMP)

Film Formation and Film Characteristics

The electrically conducting composition prepared following the above procedure is filtered using a PTFE membrane filter, 25 mm in diameter, having a pore diameter of 0.45 μm. The filtered conducting composition was applied by spin coating to an ITO glass substrate which has undergone ozone cleaning. The spin rate was maintained between 1000 to 2000 rpm over a period of 10 to 90 sec. The coated substrate was baked at 120° C. for 30 min on a hot plate. The thickness of the films formed on the substrate were measured using Mission peak optics thin film measurement unit, MP 100S (Table 6).

Further the conductivity of the films thus formed after spin coating were measured using KeithLink HR-IV Measurement Program, four point probe resistivity measurements, wherein the film resistivity is measured and film conductivity is calculated as the reciprocal of film resistivity.

TABLE 6

Film thickness and conductivity of electrically conducting compositions

| Entry | Film quality | Film thickness (nm) | Conductivity (S/cm) |
|---|---|---|---|
| FEX-1 | o | 88 | $2.2 \times 10^{-3}$ |
| FEX-2 | x | — | — |
| FEX-3 | o | 80 | $1.0 \times 10^{-4}$ |
| FEX-7 | o | 106 | $2.28 \times 10^{-4}$ |
| FEX-8 | o | 114 | $1.55 \times 10^{-4}$ |
| FEX-10 | o | 184 | $2.27 \times 10^{-4}$ |
| FEX-11 | o | 15 | $8.30 \times 10^{-4}$ |
| FEX-12 | o | 26 | $4.39 \times 10^{-3}$ |
| Comparative FEX-1 | x | — | — |
| Comparative FEX-2 | x | — | — |
| Comparative FEX-3 | x | — | — |
| Comparative FEX-4 | x | — | — |
| FEX-13 | o | 90 | $9.39 \times 10^{-4}$ |
| FEX-14 | o | 103 | $1.04 \times 10^{-3}$ |
| FEX-15 | x | — | — |
| FEX-16 | o | 40 | $2.26 \times 10^{-4}$ |
| FEX-17 | o | 45 | $2.13 \times 10^{-4}$ |
| Comparative FEX-5 | x | — | — | o Good
x poor

These layers were then used as hole injection/hole transport layers, in the fabrication of organic electroluminescent devices.

Device Example 1

Fabrication of Organic EL Device

Prior to use, the substrate was degreased with solvents and cleaned in a UV zone before it was loaded into the evaporation system.

The hole injecting layer of the current invention was coated on a prior cleaned ITO substrate and solvent evaporated as discussed earlier; the substrate then was transferred into a vacuum deposition chamber for deposition of all other layers on top of the hole injecting layer containing substrate. The following layers were deposited in the following sequence; as shown in FIG. 2, by evaporation from a heated boat under a vacuum of approximately $10^{-6}$ Torr:

a) a hole injecting layer, 40 mm thick, containing the electrically conducting composition FEX-16;
b) a hole transporting layer, 80 nm thick, N,N'-di-1-naphthyl-N,N'-diphenyl-4,4'-diaminobiphenyl (NPB);
c) a light emitting layer, 30 nm thick, comprising OFT doped with 5% GD by volume;
(GH and GD from E-ray optoelectronics Tech Co. Ltd, Taiwan)
e) an electron transport layer, 30 nm thick, aluminum tris quinolate, Alq3;
f) an electron injection layer, 1 nm thick, LiF; and
g) a cathode: approximately 150 nm thick, including Al.

Device structure may be denoted as: ITO/FEX-16 (40 nm)/NPB (80 nm)/GH-3% GD (30 nm)/Alq3 (30 nm)/LiF (1 nm)/Al (150 nm).

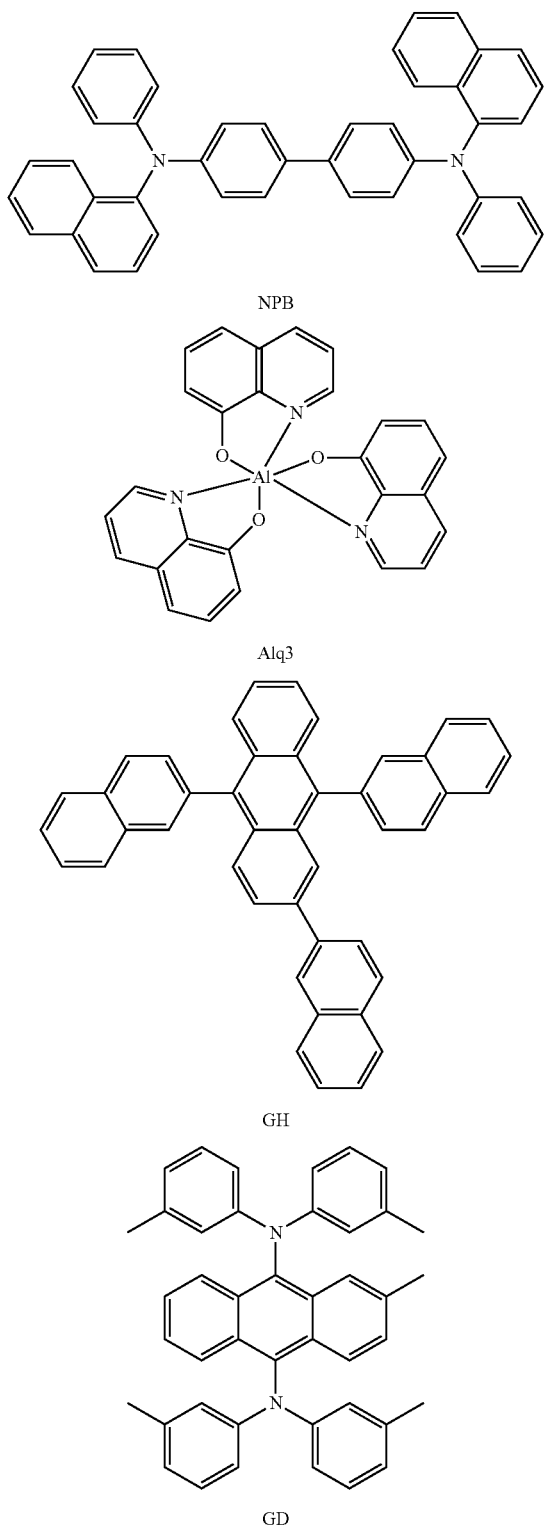

After the deposition of these layers, the device was transferred from the deposition chamber into a dry box for encapsulation, and were subsequently encapsulated using an UV-curable epoxy, and a glass lid containing a moisture getter. The organic EL has an emission area of 3 mm². The organic EL device thus obtained was connected to an outside power source and, upon application of direct current voltage, emission of light with the characteristics shown in Table 7 were confirmed.

The EL characteristics of all the fabricated devices were evaluated using a constant current source (KEITHLEY 2400 Source Meter, made by Keithley Instruments, Inc., Cleveland, Ohio) and a photometer (PHOTO RESEARCH SpectraScan PR 650, made by Photo Research, Inc., Chatsworth, Calif.) at room temperature.

Operational lifetime (or stability) of the devices were tested at the room temperature and at various initial luminance depending on the color of the emitting layer, by driving a constant current through the devices. The color was reported using Commission Internationale de l'Eclairage (CIE) coordinates.

Device Example 2 and Comparative Example 1 were fabricated using the electrically conducting composition FEX-17, in the hole injecting layer following the procedure as in Device Example 1.

Comparative Example 1

Fabrication of Organic EL Device

Organic phosphorescent EL device was fabricated similar to the layer structure as device example 1 except that EHI609 (e-Ray optoelectronics tech. Co. Ltd, proprietary hole injection OLED material—small molecule) was used in place of FEX-16, in the hole injection layer. Device structure may be denoted as: ITO/EHI 609 (30 nm)/NPB (80 nm)/GH-5% GD (30 nm)/Alq$_3$ (30 nm)/LiF (1 nm)/Al (150 nm).

Figure 4:
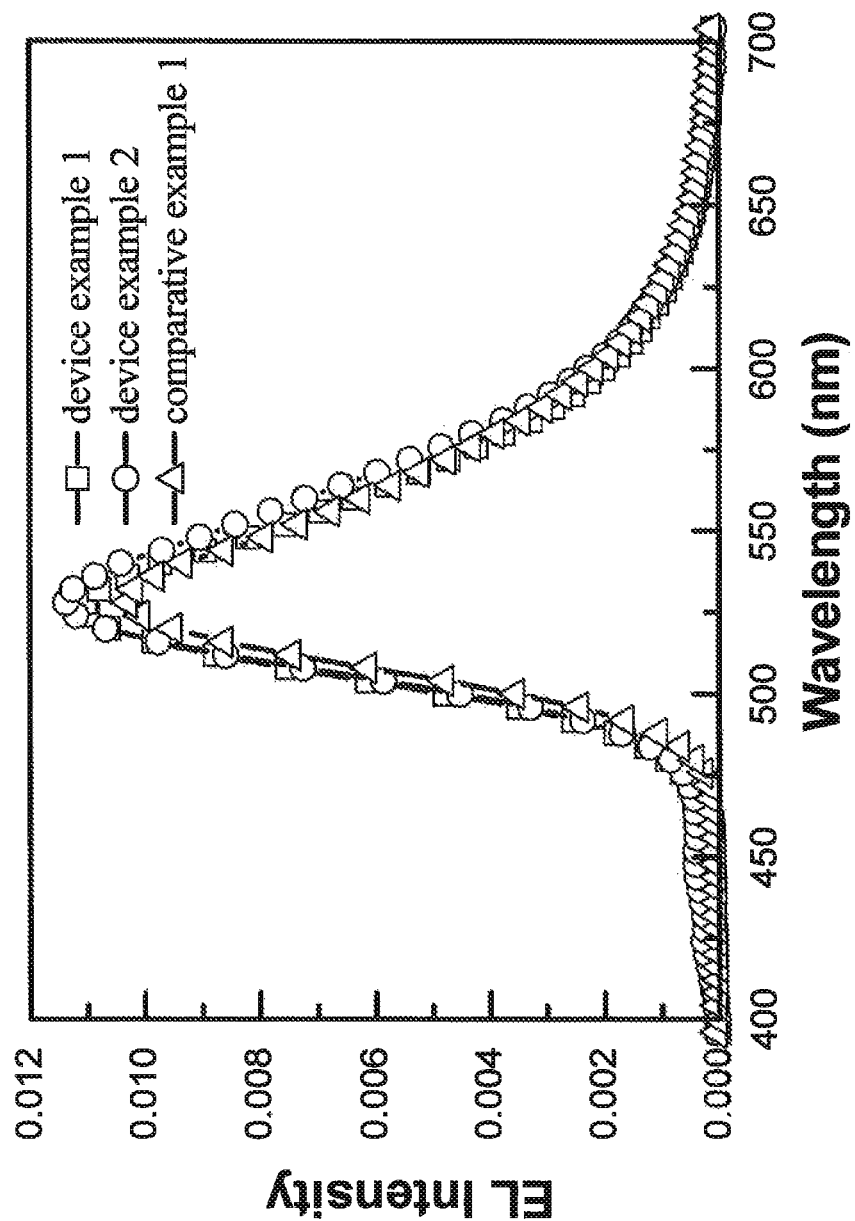
FIG. 4 shows the electroluminescent spectrum of the organic electroluminescent device examples 1, 2 and comparative example 2 according to the present invention.

The peak wavelength of emitted light, maximum luminance efficiency and the color co-ordinates of the organic EL devices are shown in Table 7. EL spectra of these organic EL devices are shown in FIG. 4.

TABLE 7

EL characteristics

| Entry | Hole injecting layer | Peak Wavelength (nm) | CIE (x, y) | Max. luminous efficiency |
|---|---|---|---|---|
| Device Example 1 | FEX-16 | 528 | 0.296, 0.615 | 5.94 |
| Device Example 2 | FEX-17 | 528 | 0.306, 0.609 | 6.37 |
| Comparative Example 1 | EHI609 | 528 | 0.318, 0.628 | 28.29 |

The invention shall not be limited by the above described embodiment, method and examples, but by all embodiments and methods within the scope and spirit of the invention as claimed.

INDUSTRIAL APPLICABILITY

As described above in detail, the organic EL device using the present invention as the hole injection/hole transport layer renders cost-effectiveness to the manufacture of the EL devices, thereby making the process more commercially amenable. Also, the present invention finds potential in organic photovoltaic applications.

The invention claimed is:

1. An electrically conducting composition, comprising:
    a composite comprising carbon nano particles and charge transporting oligomers of 1.0001 to 5.01% by weight, based on a total weight of the electrically conducting composition;
    an electron accepting dopant of 0.001 to 5% by weight, based on a total weight of the electrically conducting composition; and
    at least two solvents.

2. The electrically conducting composition according to claim 1, further comprising 1,3-dialkylimidazolium ionic liquid of 0.01 to 0.5% by weight, based on a total weight of the electrically conducting composition.

3. The electrically conducting composition according to claim 2, wherein the alkyl groups of imidazolium ionic liquid are in a range of from C1 to C16 and the 1,3-dialkylimidazolium ionic liquid has a corresponding anion selected from the group consisting of hexafluoro phosphate, tetra fluoroborate, and trifluoromethane sulfonamide.

4. The electrically conducting composition according to claim 1, wherein the carbon nano particles in the composite are 0.0001 to 0.01% by weight, based on a total weight of the electrically conducting composition.

5. The electrically conducting composition according to claim 1, wherein the carbon nano particles in the composite are selected from the group consisting of multi walled carbon nanotube (MWCNT), modified MWCNT, and MWCNT composite.

6. The electrically conducting composition according to claim 1, wherein the charge transporting oligomers in the composite are selected from the group consisting of oligoanilines, amino oligoanilines, oligothiophenes and mixtures thereof.

7. The electrically conducting composition according to claim 6, wherein each of the charge transporting oligomers has a number of monomer units from 2 to 16.

8. The electrically conducting composition according to claim 1, wherein the electron accepting dopant is a sulfonic acid group containing a compound.

9. The electrically conducting composition according to claim 8, wherein the sulfonic acid group containing a compound is selected from the group consisting of 5-sulfosalicylic acid, polystyrene sulfonic acid, dodecyl benzene sulfonic acid, toluene sulfonic acid and perfluorinated sulfonic acid polymer.

10. The electrically conducting composition according to claim 1, wherein the at least two solvents are selected from the group consisting of cyclohexanol, 1,3-dimethyl-2-imidazolidinone, dimethylacetamide, dimethylsulfoxide, dimethylformamide, N-methyl pyrrolidone, toluene, xylene, tetralone, butanol, ethylene glycol and glycerol.

* * * * *